United States Patent
Joshi et al.

(10) Patent No.: US 11,527,991 B2
(45) Date of Patent: Dec. 13, 2022

(54) CIRCUIT FOR EXTENDED VOLTAGE CONTROL OSCILLATOR GAIN LINEARITY

(71) Applicant: Synopsys, Inc., Mountain View, CA (US)

(72) Inventors: Akarsh Joshi, Kundalahalli (IN); Biman Chattopadhyay, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/456,035

(22) Filed: Nov. 22, 2021

(65) Prior Publication Data

US 2022/0166381 A1    May 26, 2022

Related U.S. Application Data

(60) Provisional application No. 63/117,340, filed on Nov. 23, 2020.

(51) Int. Cl.
*H03B 5/12* (2006.01)
*H03L 7/099* (2006.01)

(52) U.S. Cl.
CPC .......... *H03B 5/1243* (2013.01); *H03B 5/1206* (2013.01); *H03B 5/1265* (2013.01); *H03L 7/099* (2013.01); *H03B 2201/0208* (2013.01)

(58) Field of Classification Search
CPC ............ H03L 7/099; H03B 2201/0208; H03B 5/1243; H03B 5/1265; H03B 5/1206
USPC ................................. 331/167, 117 FE, 177 V
See application file for complete search history.

(56) References Cited

U.S. PATENT DOCUMENTS

| | | | | |
|---|---|---|---|---|
| 7,298,225 B2* | 11/2007 | Sze | ...................... | H03B 5/1265 331/177 V |
| 7,557,668 B2* | 7/2009 | Jang | ...................... | H03B 5/1228 331/177 V |
| 2008/0204157 A1* | 8/2008 | Tsu | ...................... | H03B 5/1243 331/115 |

* cited by examiner

*Primary Examiner* — Arnold M Kinkead
(74) *Attorney, Agent, or Firm* — Patterson + Sheridan, LLP

(57) ABSTRACT

A voltage controlled oscillator (VCO) circuitry includes a varactor array. The varactor array includes a first varactor unit including a first varactor, a second varactor, and first switch circuitry. The first varactor is connected to a first node and a second node, and the second varactor is connected to the second node and a third node. The second node receives a voltage control signal. The first switch circuitry is electrically coupled to the first node and the third node, and selectively electrically couples a first voltage signal to the first node and the third node based on a first control signal.

20 Claims, 9 Drawing Sheets

CIRCUIT FOR EXTENDED VOLTAGE CONTROL OSCILLATOR GAIN LINEARITY

RELATED APPLICATION

This application claims the benefit of U.S. provisional patent application Ser. No. 63/117,340, filed Nov. 23, 2020, which is hereby incorporated herein by reference.

TECHNICAL FIELD

The present disclosure generally relates to an electronic circuit. In particular, the present disclosure relates to a voltage controlled oscillator with programmable gain levels.

BACKGROUND

A voltage controlled oscillator (VCO) generates output signals based on an oscillation frequency of the VCO. The VCO includes varactors that are capacitance tuning devices to control (e.g., tune) the oscillation frequency of the VCOs and, correspondingly, the frequency of the output signal. The varactors tune the oscillation frequency of the VCO corresponding to a capacitive voltage (CV) curve of the varactors. The capacitance voltage (CV) curve of the varactor corresponds to the manufacturing process parameters. Variations in the manufacturing process parameters alter the capacitance of the varactors and the frequency of the oscillation of the VCO.

A phase locked loop (PLL) device includes a VCO. In a PLL device, a charge pump provide control voltages to the VCO with a wide range of voltages to generate output signals at different frequencies. In a PLL device, the gain of the VCO is maintained at a high level to track process, voltage, and temperature variations of the PLL device. The gain of a VCO is sensitive to the frequency of the output signals, and varies by orders of magnitude to support a wide range of output frequencies. Accordingly, VCOs are commonly redesigned to support different voltage ranges.

SUMMARY

In one example, voltage controlled oscillator (VCO) circuitry includes a varactor array. The varactor array includes a first varactor unit including a first varactor, a second varactor, and first switch circuitry. The first varactor is connected to a first node and a second node, and the second varactor is connected to the second node and a third node. The second node receives a voltage control signal. The first switch circuitry is electrically coupled to the first node and the third node, and selectively electrically couples a first voltage signal to the first node and the third node based on a first control signal.

In one example, a varactor array comprises a first varactor unit and a second varactor unit. The first varactor unit receives a first control signal and a voltage control signal. The first varactor unit selectively receives a first bias voltage signal or a reference voltage signal to respectively enable or disable the first varactor unit based on the first control signal. The second varactor unit receives a second control signal and the voltage control signal. The second varactor unit selectively receives a second bias voltage signal or the reference voltage signal to respectively enable or disable the second varactor unit based on the second control signal. The varactor array outputs an output signal based on one or more of a first voltage difference and a second voltage difference. The first voltage difference is between the voltage control signal and the first bias voltage signal. The second voltage difference is between the voltage control signal and the second bias voltage signal.

In one example, a method for operating voltage controlled oscillator (VCO) circuitry includes receiving, by a first varactor unit of inductor capacitor (LC) tank circuitry, a voltage control signal. The method further includes selectively electrically coupling the first varactor unit to a first bias voltage signal to enable the first varactor unit and a reference voltage signal to disable the first varactor unit based on a first control signal. Further, the method includes receiving, by a second varactor unit of the LC tank circuitry, the voltage control signal. The method additionally includes selectively enabling coupling the second varactor unit to a second bias voltage signal to enable the second varactor unit and the reference voltage signal to disable the second varactor unit based on a second control signal. Enabling at least one of the first varactor unit and the second varactor unit adjusts a capacitance of the LC tank circuitry. The second control signal and the first control signal are different. Further, the method includes outputting an output signal having an oscillation frequency based on the voltage control signal and the adjusted capacitance of the LC tank circuitry.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a circuit for extended voltage control oscillator (VCO) gain linearity. VCO circuitry includes a varactor array having multiple varactor units. Accordingly, oscillator circuitry, e.g., phase locked loop (PLL) circuitry that includes such VCO circuitry supports wider frequency tuning characteristics. Further, the gain linearity and linear operating voltage range of VCO circuitry that includes a varactor array having multiple varactor units is increased as compared to typical VCO circuitry designs.

In the following, VCO circuitry including a varactor array having two or more varactor units. The varactor units are selectively enabled and disabled to add programmability to the corresponding VCO circuitry. Further, using multiple varactor units extends the gain linearity range of a VCO. For example, the gain linearity range can be extended N times by using N number of varactor units as compared to typical VCO circuitry that includes a single varactor unit, where N is a positive integer. Further, by using N number of varactor units, the gains of enabled varactor units are combined, which allows the gains of each individual varactor to be reduced, as compared to single varactor VCO circuitry, improving jitter performance of the VCO circuitry.

Figure 1:
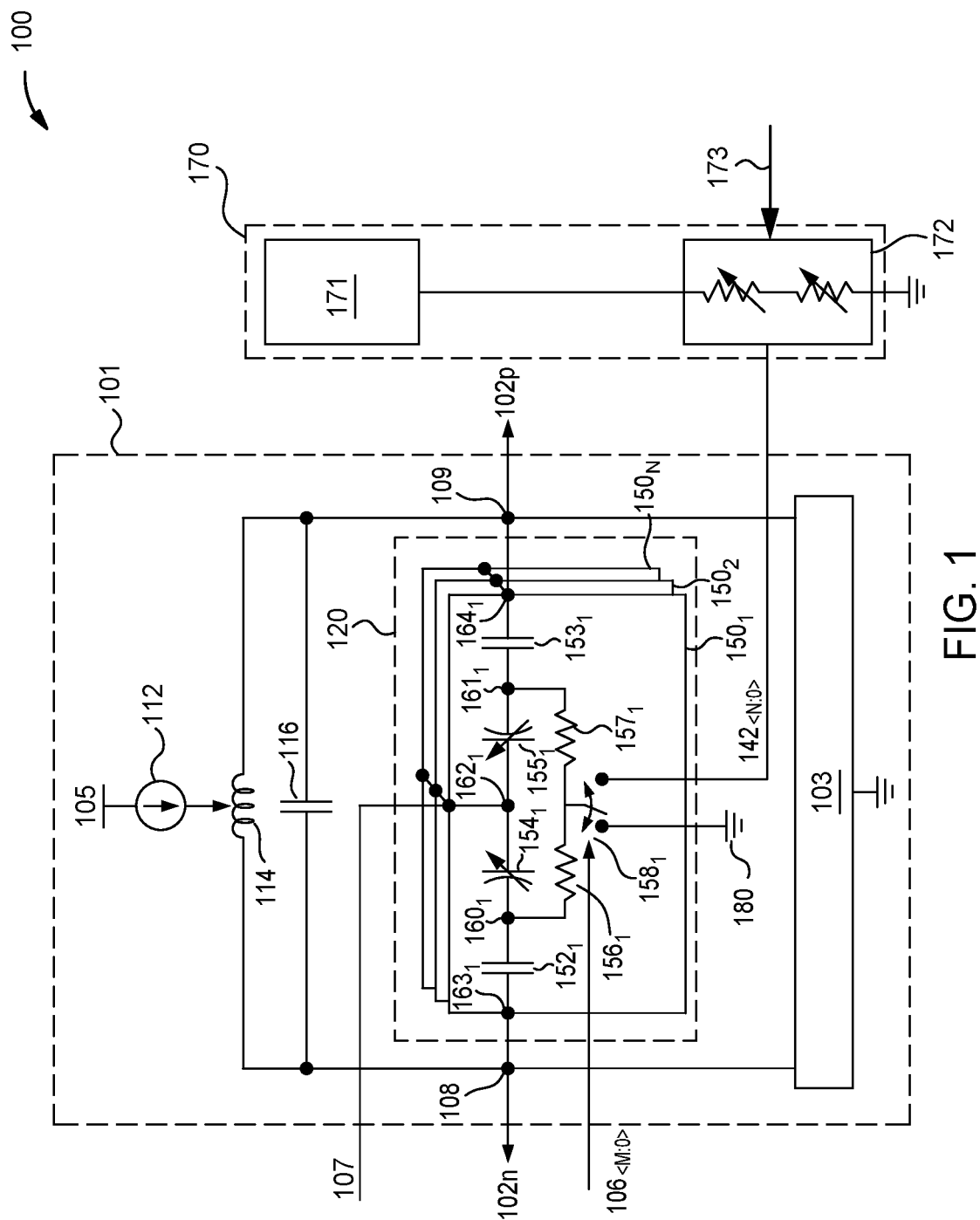
FIG. 1 depicts a schematic diagram of voltage controlled oscillator circuitry, according to one embodiment of the present disclosure.

FIG. 1 illustrates voltage controlled oscillator (VCO) circuitry 100, according to one embodiment of the present disclosure. The VCO circuitry 100 generates an output signal 102 having an oscillation frequency. The VCO circuitry 100 includes inductor capacitor (LC) tank circuitry 101 and bias voltage generator circuitry 170. The LC tank circuitry 101 generates the output signal 102. The output signal 102 includes a positive output signal 102$p$ output via node 109, and a negative output signal 102$n$ output via node 108. The LC tank circuitry 101 includes a current source 112, an inductor 114, a capacitor 116, a varactor array 120, and negative transconductance circuitry 103.

The bias voltage generator circuitry 170 includes voltage generation circuitry 171 and the resistor string 172. The resistor string 172 is connected between the output of the voltage generation circuitry 171 and the varactor array 120.

The LC tank circuitry 101 receives a voltage signal 105 from a voltage source, a control signal 106, and a voltage control signal 107. The control signal 106 is received from a controller or other control circuitry. The voltage control signal 107 is received from charge pump circuitry or another voltage source (not shown). The LC tank circuitry 101 outputs the output signal 102 based on the voltage signal 105, the control signal 106, the voltage control signal 107, and current signals provided by the negative transconductance circuitry 103.

In one example, the negative transconductance circuitry 103 includes one or more cross-coupled transistors. The negative transconductance circuitry 103 provides a first current signal that flows between the node 108 and the negative transconductance circuitry 103, and a second current signal that flows between the node 109 and the negative transconductance circuitry 103. In one example, a first current signal flows from the node 108 to negative transconductance circuitry 103 and a second current signal flows from the negative transconductance circuitry 103 to the node 109. The first and second current signals aid in the oscillation of the VCO circuitry 100 and the output signal 102.

The voltage signal 105 drives the LC tank circuitry 101, and the control signal 106 enables and disables respective varactor units 150 of the LC tank circuitry. The voltage control signal 107 controls the varactor capacitance of enabled varactor units of the LC tank circuitry 101, controlling the frequency of the output signal 102. The output signal 102 is output based on a difference between the voltage control signal 107 and the bias voltage signal 142.

The inductor 114 is connected in parallel with the capacitor 116 and the varactor array 120. Accordingly, the inductor 114, the capacitor 116, and the varactor array 120 are driven by the current source 112 based on the voltage signal 105.

The capacitor 116 has a fixed capacitance. In one example, the capacitor 116 has a fixed capacitance in a range of about above $50e^{-15}$ F and $200e^{-15}$ F. The capacitance of the varactor array 120 is variable. Varying the capacitance of the varactor array 120 tunes (alters) the frequency of the output signal 102 and/or gain of the VCO circuitry 100.

The varactor array 120 includes N number of varactor units shown as $150_1$, $150_2$, and $150_N$. N includes one or more varactor units. Each of the varactor units 150 is coupled in parallel between nodes 108 and 109 of the LC tank circuitry 101. Each of the varactor units 150 receives the voltage control signal 107. The varactor units 150 receive the voltage control signal 107 in parallel to each other. Further, each of the varactor units 150 receives a corresponding bias voltage signal 142 and a corresponding control signal 106. The bias voltage signal 142 and the control signal 106 are received in during an overlapping period of time. In one example, the varactor unit $150_1$ receives the bias voltage signal $142_1$ and the control signal $106_1$. Further, the varactor unit $150_N$ receives the bias voltage signal $142_N$ and the control signal $106_M$. M and N are one or more. In one example, M is greater than or less than N. In another example, M is equal to N. The voltage level of the bias voltage signal 142 is in a range of about 100 mV to about 1 V. In other examples, the voltage level of the bias voltage signal 142 is less than 100 mV or greater than 1 V.

The control signal 106 includes multiple bits (e.g., a bit for each varactor unit 150) and is communicated to the varactor units 150 via a communication bus. Each bit corresponds to a different one of the control signals $106_1$-$106_M$. The bits are set to a logic value of 1 (e.g., a high voltage value) or a logic value of 0 (e.g., a low voltage value). The number of bits is equal to the number of varactor units 150.

The varactor units 150 are configured similar to each other. For example, each of the varactor units 150 includes capacitors 152 and 153, varactors 154 and 155, resistors 156, 157, and switch circuitry 158. As will be described in greater detail in the following, the switch circuitry 158 selectively couples a first node (e.g., the node 160) associated with the varactor 154 and a second node (e.g., the node 161) associated with the varactor 155 with a reference voltage signal 180 or a bias voltage signal 142. Further, the voltage control signal 107 is received at a node (e.g., the node 162) between the varactors 154 and 155. In one example, based on the switch circuitry 158 coupling the node 160 and the 161 with the bias voltage signal 142, the output signal 102 is based on a difference between the voltage control signal 107 and the bias voltage signal 142.

In one example, the varactors 154 and 155 have a variable capacitance value that varies from about $15e^{-15}$ F to about $30e^{-15}$ F. In other examples, the variable capacitance of the varactors 154 and 155 may include capacitance values less than about $15e^{-15}$ and/or greater than about $30e^{-15}$ F. Further, in one example, the capacitors 152 and 153 have a capacitance value of $120e^{-15}$ F, and the resistors 156 and 157 are fixed resistors and have a resistance value of about $2e^3$ Ohms. In other examples the capacitors 152 and 153 may have capacitance values greater than or less than $120e^{-15}$ F. Further, in one or more examples, the resistors 156 and 157 have resistance values greater than or less than $2e^3$ Ohms. The resistance values of the resistors correspond to the thermal noise specification of the corresponding system design. In one or more examples, the varactors 154 and 155 have a variable capacitance of Cv<M:0>, the capacitors 152 and 153 have a fixed capacitance of Cf<M:0>, and the resistors 156 and 157 have a resistance corresponding to Rs<M:0>. M is one or more and corresponds to the number of capacitances in a varactor unit. In one example, a varactor unit comprises an array of M capacitances that each may vary from about $15e^{-15}$ F to about $45e^{-15}$ F. A varactor unit may include N arrays of M capacitances. N is greater than, less, than or equal to M. In such an example, the voltage bias signal 142 may be represented as <1:M> and the control signal 106 may be represented as <1:N>.

Figure 2:
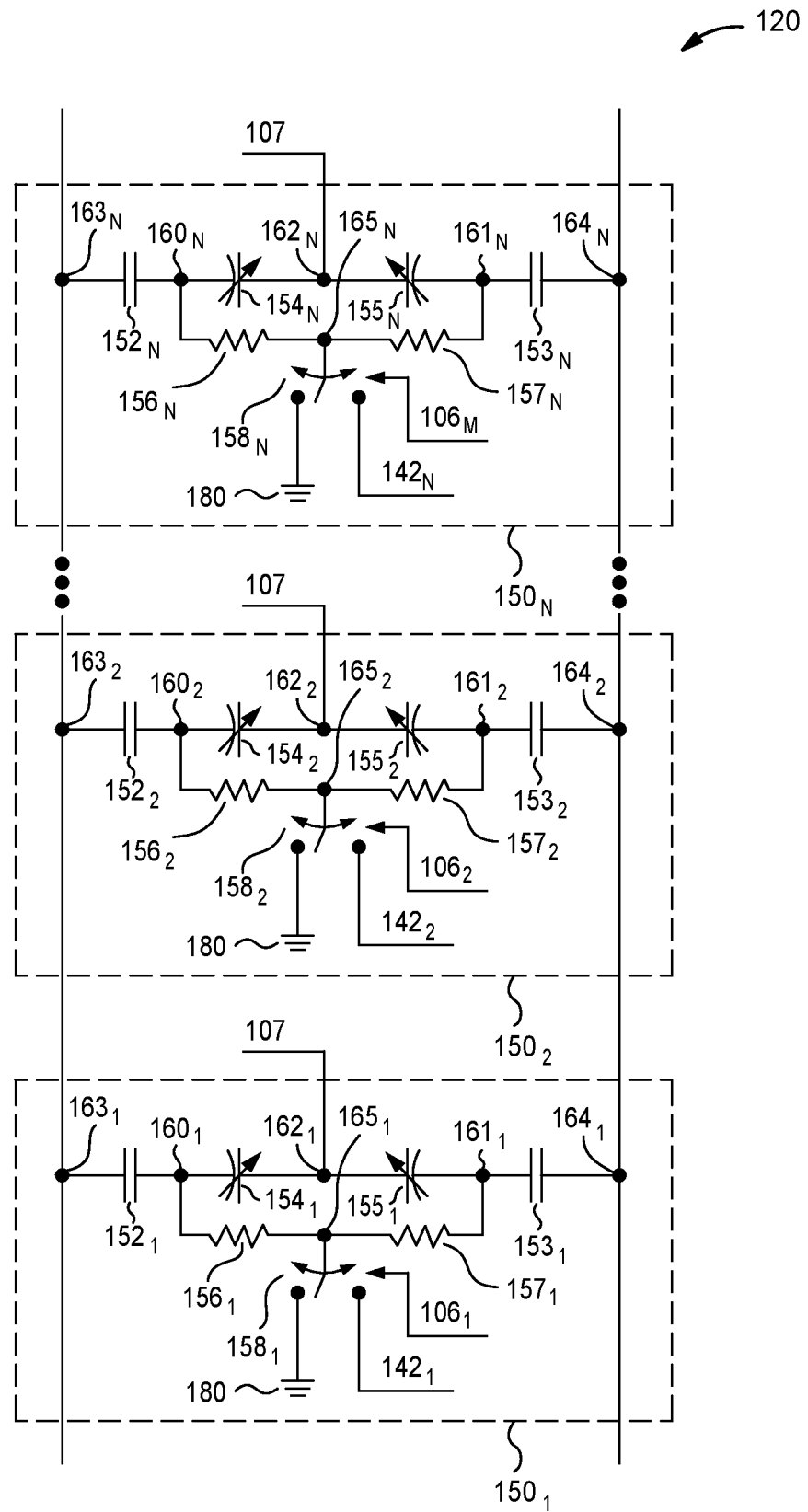
FIG. 2 depicts a schematic diagram of a varactor array including multiple varactor units, according to one embodiment of the present disclosure.

FIG. 2 illustrates a schematic diagram of a varactor array including multiple varactor units, according to one embodiment of the present disclosure. The varactor array 120 includes the varactor units $150_1$-$150_N$. The varactor array 120 adjusts the capacitance of the LC tank circuitry 101, adjusting the output signal 102 based on a voltage difference across varactors of the varactor units $150_1$-$150_N$. The varactor unit $150_1$ includes capacitors $152_1$ and $153_1$, varactors $154_1$ and $155_1$, resistors $156_1$ and $157_1$, and switch circuitry $158_1$. The varactors $154_1$ and $155_1$ are connected in series between nodes $160_1$ and $161_1$. The varactors $154_1$ and $155_1$ are connected via node $162_1$. The capacitor $152_1$ is connected between the node $163_1$ and $160_1$. The capacitor $153_1$ is connected between the nodes $161_1$ and $164_1$.

The switch circuitry $158_1$ is connected to the node $165_1$. The node $165_1$ is disposed between the resistor $156_1$ and the resistor $157_1$. The node $165_1$ is electrically coupled to the nodes $160_1$ and $161_1$ via the resistors $156_1$ and $157_1$, respectively. The switch circuitry $158_1$ selectively couples the node $165_1$ to the reference voltage signal 180 or to the bias voltage signal $142_1$. Selecting coupling the node $165_1$ to the reference voltage signal 180 or to the bias voltage signal $142_1$ selectively couples the nodes $160_1$ and $161_1$ to the reference voltage signal 180 or to the bias voltage signal $142_1$ via the resistors $156_1$ and $157_1$. The switch circuitry $158_1$ selectively couples the node $165_1$ to the reference voltage signal 180 or to the bias voltage signal $142_1$ (e.g., the output of the bias voltage generation circuitry 170) based on the control signal $106_1$. For example, based on the control signal $106_1$ having a logic value of 1 (e.g., a high voltage value), the switch circuitry $158_1$ couples the node $165_1$ to the bias voltage signal $142_1$. Coupling the node $165_1$ to the bias voltage signal $142_1$, couples the nodes $160_1$ and $161_1$ to the bias voltage signal $142_1$ via the resistors $156_1$ and $157_1$. In one example, based on the node $165_1$ being connected to the bias voltage signal $142_1$, the varactors $154_1$ and $155_1$ operate in a depletion mode and function as voltage dependent capacitors. Accordingly, the varactor unit $150_1$ operates in a corresponding linear range of capacitance-voltage (CV) characteristics with gain of greater than 0. Further, the frequency of the oscillation of the output signal 102 is adjusted based on connecting the node $165_1$ to the bias voltage signal $142_1$, as the varactors $154_1$ and $155_1$ operate in a depletion mode based on connecting the node $165_1$ to the bias voltage signal $142_1$. Operating the varactors $154_1$ and $155_1$ in a depletion mode makes the capacitance of the varactors $154_1$ and $155_1$ dependent on the voltage control signal 107. Accordingly, the variable capacitances of the varactors $154_1$ and $155_1$ are controlled by the voltage level of the voltage control signal 107. In one example, the capacitance of the varactors $154_1$ is adjusted to increase the capacitance of the LC tank circuitry 101, decreasing the oscillation frequency at the nodes $163_1$ and $164_1$, and, respectively, the oscillation frequency at the nodes 108 and 109 and the output signals 102n and 102p. In one example, the frequency of the oscillation of the output signal 102 is decreased based on connecting the node $165_1$ to the bias voltage signal $142_1$.

Further, based on the control signal $106_1$ having a logic value of 0 (e.g., a low voltage value), the switch circuitry $158_1$ couples the node $165_1$ to the reference voltage signal 180. Coupling the node $165_1$ to the reference voltage signal 180, couples the nodes $160_1$ and $161_1$ to the reference voltage signal 180 via the resistors $156_1$ and $157_1$. Accordingly, the varactors $154_1$ and $155_1$ are not placed in a depletion mode, and function as fixed capacitors. Accordingly, the varactor unit $150_1$ does not add a capacitance variation to the varactor array 120 and the LC tank circuitry 101. In other examples, other logic values may be used to control the switch circuitry $158_1$ to connect the node $165_1$ to the reference voltage signal 180 and the bias voltage signal $142_1$. A voltage level of the reference voltage signal 180 is less than the voltage value of the voltage control signal 107, which is less than the voltage level of the bias voltage signal 142.

The voltage control signal 107 is received by the varactor unit $150_1$ at the node $162_1$. The varactor unit $150_1$ provides linear capacitance tuning with reference to the voltage control signal 107. For example, based on the switch circuitry $158_1$ connecting the node $165_1$, and, correspondingly, the nodes $160_1$ and $161_1$, to the bias voltage signal $142_1$, the varactor unit $150_1$ is enabled, and the varactor unit $150_1$ provides linear capacitance tuning with reference to the voltage control signal 107. For example, the voltage control signal 107 determines a voltage at the node $162_1$ and the bias voltage signal $142_1$ determines the voltage at the nodes $160_1$ and $161_1$, respectively. In one example, the output signal 102 is based on a voltage difference between the voltage level of the bias voltage signal $142_1$ at the nodes $160_1$ and $161_1$ and the voltage level of the voltage control signal 107 at the node $162_1$. Increasing or decreasing the bias voltage signal $142_1$, increases or decreases the voltage at nodes $160_1$ and $161_1$, respectively. Accordingly, the voltage across the varactors (e.g., a difference between the voltages at nodes $160_1$ and $161_1$ and the voltage at the node $162_1$) is increased or decreased, respectively, tuning the linear capacitance of the varactor unit $150_1$. In one example, based on the switch circuitry $158_1$ coupling the node $165_1$, and, correspondingly, the nodes $160_1$ and $161_1$, to the reference voltage signal 180, the varactor unit $150_1$ is disabled, and the varactor unit $150_1$ does not provide linear capacitance tuning with reference to the voltage control signal 107. The control signal $106_1$ controls the switch circuitry $158_1$ to couple the node $165_1$, and, correspondingly, the nodes $160_1$ and $161_1$, to the bias voltage signal $142_1$ based on the control signal $106_1$ having a logic value of 1, and the control signal $106_1$ controls the switch circuitry $158_1$ to couple the node $165_1$, and, correspondingly, the nodes $160_1$ and $161_1$, to the reference voltage signal 180 based on the control signal $106_1$ having a logic value of 0.

The varactor unit $150_2$ includes capacitors $152_2$ and $153_2$, varactors $154_2$ and $155_2$, resistors $156_2$ and $157_2$, and switch circuitry $158_2$. The varactors $154_2$ and $155_2$ are connected in series between nodes $160_2$ and $161_2$. The varactors $154_2$ and $155_2$ are connected via node $162_2$. The capacitor $152_2$ is connected between the node $163_2$ and $160_2$. The capacitor $153_2$ is connected between the nodes $161_2$ and $164_2$.

The switch circuitry $158_2$ is connected to the node $165_2$. The node $165_2$ is disposed between the resistor $156_2$ and the resistor $157_2$. The node $165_2$ is connected to the nodes $160_2$ and $161_2$ via the resistors $156_2$ and $157_2$, respectively. The switch circuitry $158_2$ selectively couples the node $165_2$ to the reference voltage signal 180 or to the bias voltage signal $142_2$. Selecting coupling the node $165_2$ to the reference voltage signal 180 or to the bias voltage signal $142_2$ selectively couples the nodes $160_2$ and $161_2$ to the reference voltage signal 180 or to the bias voltage signal $142_2$ via the resistors $156_2$, $157_2$, respectively. The switch circuitry $158_2$ selectively couples node $165_2$ to the reference voltage signal 180 or to the bias voltage signal $142_2$ based on the control signal $106_2$. For example, based on the control signal $106_2$ having a logic value of 1, the switch circuitry $158_2$ connects the node $165_2$ to the bias voltage signal $142_2$. Coupling the node $165_2$ to the bias voltage signal $142_2$, couples the nodes $160_2$ and $161_2$ to the bias voltage signal $142_2$ via the resistors $156_2$ and $157_2$. Coupling the node $165_2$ to the bias voltage signal $142_2$, couples the nodes $160_2$ and $161_2$ to the bias voltage signal $142_2$ via the resistors $156_2$ and $157_2$. In one example, based on the node $165_2$ being connected to the bias voltage signal $142_2$, the varactors $154_2$ and $155_2$ operate in a depletion mode and function as capacitors. Accordingly, the varactor unit $150_2$ operates in a corresponding linear range of CV characteristics with gain of greater than 0. Further, the frequency of the oscillation of the output signal 102 is adjusted based on connecting the node $165_2$ to the bias voltage signal $142_2$, as the varactors $154_2$ and $155_2$ operate in a depletion mode based on connecting the node $165_2$ to the bias voltage signal $142_2$. Operating the varactors $154_2$ and $155_2$ in a depletion mode increases the capacitance of the varactor array 120, and the LC tank circuitry 101, decreasing the oscillation frequency at the nodes $163_2$ and $164_2$, and, respectively, the nodes 108 and 109 and the outputs 102n and 102p. In one example, the frequency of the oscillation of the output signal 102 is decreased based on connecting the node $165_2$ to the bias voltage signal $142_2$.

Further, based on the control signal $106_2$ having a logic value of 0, the switch circuitry $158_2$ couples the node $165_2$ to the reference voltage signal 180. Coupling the node $165_2$ to the reference voltage signal 180, couples the nodes $160_2$ and $161_2$ to the reference voltage signal 180 via the resistors $156_2$ and $157_2$. Coupling the node $165_2$ to the reference voltage signal 180, couples the nodes $160_2$ and $161_2$ to the reference voltage signal 180 via the resistors $156_2$ and $157_2$. Accordingly, the varactors $154_2$ and $155_2$ are not placed in a depletion mode, and do not function as capacitors. Accordingly, the varactor unit $150_2$ does not add capacitance to the varactor array 120 and the LC tank circuitry 101.

The voltage control signal 107 is received by the varactor unit $150_2$ at the node $162_2$. The varactor unit $150_2$ provides linear capacitance tuning versus the voltage control signal 107. In one example, based on the switch circuitry $158_2$ coupling the node $165_1$, and, correspondingly, the nodes $160_2$ and $161_2$, to the bias voltage signal $142_2$, the varactor unit $150_2$ is enabled, and the varactor unit $150_2$ provides linear capacitance tuning with reference to the voltage control signal 107. For example, the voltage control signal 107 determines a voltage at the node $162_2$ and the bias voltage signal $142_2$ determines the voltage at the nodes $160_2$ and $161_2$ respectively. In one example, the output signal 102 is based on a difference between the voltage level of the bias voltage signal $142_2$ at the nodes $160_2$ and $161_2$ and the voltage level of the voltage control signal 107 at the node $162_2$. Increasing or decreasing the bias voltage signal $142_2$, increases or decreases the voltage at nodes $160_2$ and $161_2$, respectively. Accordingly, the voltage across the varactors $154_2$ and $155_2$ (e.g., a difference between the voltages at nodes $160_2$ and $161_2$ and the voltage at the node $162_2$) is increased or decreased, respectively, tuning the linear capacitance of the varactor unit $150_2$. Based on the switch circuitry $158_2$ coupling the node $165_1$, and, correspondingly, the nodes $160_2$ and $161_2$, to the reference voltage signal 180, the varactor unit $150_2$ is disabled, and the varactor unit $150_2$ does not provide linear capacitance tuning with reference to the voltage control signal 107. The control signal $106_2$ controls the switch circuitry $158_2$ to couple the node $165_1$, and, correspondingly, the nodes $160_2$ and $161_2$, to the bias voltage signal $142_2$ based on the control signal $106_2$ having a logic value of 1, and the control signal $106_2$ controls the switch circuitry $158_2$ to couple the node $165_1$, and, correspondingly, the nodes $160_2$ and $161_2$, to the reference voltage signal 180 based on the control signal $106_2$ having a logic value of 0.

The varactor unit $150_N$ includes capacitors $152_N$, $153_N$, varactors $154_N$, $155_N$, resistors $156_N$, $157_N$, and switch circuitry $158_N$. The varactors $154_N$ and $155_N$ are connected in series between nodes $160_N$ and $161_N$. The varactors $154_N$ and $155_N$ are connected via node $162_N$. The capacitor $152_N$ is connected between the nodes $163_N$ and $160_N$. The capacitor $153_N$ is connected between the nodes $161_N$ and $164_N$.

The switch circuitry $158_N$ is connected to the node $165_N$. The node $165_N$ is disposed between the resistor $156_N$ and the resistor $157_N$. The node $165_N$ is connected to the nodes $160_N$ and $161_N$ via the resistors $156_N$ and $157_N$, respectively. The switch circuitry $158_N$ selectively couples the node $165_N$ to the reference voltage signal 180 or to the bias voltage signal $142_N$. Selecting coupling the node $165_N$ to the reference voltage signal 180 or to the bias voltage signal $142_N$ selectively couples the nodes $160_N$ and $161_N$ to the reference voltage signal 180 or to the bias voltage signal $142_N$ via the resistors $156_1$ and $157_1$. The switch circuitry $158_N$ selectively couples the node $165_N$ to the reference voltage signal 180 or to the bias voltage signal $142_N$ based on the control signal $106_M$. N is one or more. For example, based on the control signal $106_M$ having a logic value of 1, the switch circuitry $158_N$ connects the node $165_N$ to the bias voltage signal $142_N$. Coupling the node $165_N$ to the bias voltage signal $142_N$, couples the nodes $160_N$ and $161_N$ to the bias voltage signal $142_N$ via the resistors $156_N$ and $157_N$. In one example, based on the node $165_N$ being connected to the bias voltage signal $142_N$, the varactors $154_N$ and $155_N$ operate in a depletion mode and function as capacitors. Accordingly, the varactor unit $150_N$ operates in a corresponding linear range of CV characteristics with gain of greater than 0. Further, the frequency of the oscillation of the output signal 102 is adjusted based on connecting the node $165_N$ to the bias voltage signal $142_N$, as the varactors $154_N$ and $155_N$ operate in a depletion mode based on connecting the node $165_N$ to the bias voltage signal $142_N$. Operating the varactors $154_N$ and $155_N$ in a depletion mode increases the capacitance of the varactor array 120, and the LC tank circuitry 101, decreasing the oscillation frequency at the nodes $163_N$ and $164_N$, and, respectively, the nodes 108 and 109 and the outputs 102n and 102p. In one example, the frequency of the oscillation of the output signal 102 is decreased based on connecting the node $165_N$ to the bias voltage signal $142_N$.

Coupling the node $165_N$ to the bias voltage signal $142_N$, couples the nodes $160_N$ and $161_N$ to the bias voltage signal $142_N$ via the resistors $156_N$ and $157_N$. Further, based on the control signal $106_M$ having a logic value of 0, the switch circuitry $158_N$ couples the node $165_N$ to the reference voltage signal 180. Coupling the node $165_N$ to the reference voltage signal 180, couples the nodes $160_{1N}$ and $161_N$ to the reference voltage signal 180 via the resistors $156_N$ and $157_N$. Coupling the node $165_N$ to the reference voltage signal 180, couples the nodes $160_N$ and $161_N$ to the reference voltage signal 180 via the resistors $156_N$ and $157_N$. Accordingly, the varactors $154_N$ and $155_N$ are not placed in a depletion mode, and do not function as capacitors. Accordingly, the varactor unit $150_N$ does not add capacitance to the varactor array 120 and the LC tank circuitry 101.

The voltage control signal 107 is received by the varactor unit $150_N$ at the node $162_N$. The varactor unit $150_N$ provides linear capacitance tuning versus the voltage control signal 107. For example, based on the switch circuitry $158_N$ coupling the node $165_1$, and, correspondingly, the nodes $160_N$ and $161_N$, to the bias voltage signal $142_N$, the varactor unit $150_N$ is enabled, and the varactor unit $150_N$ provides linear capacitance tuning with reference to the voltage control signal 107. For example, the voltage control signal 107 determines a voltage at the node $162_N$ and the bias voltage signal $142_N$ determines the voltage at the nodes $160_N$ and $161_N$, respectively. In one example, the output signal 102 is based on a voltage difference between the voltage level of the bias voltage signal $142_N$ at the nodes $160_N$ and $161_N$ and the voltage level of the voltage control signal 107 at the node $162_N$. Increasing or decreasing the bias voltage signal $142_N$, increases or decreases the voltage at nodes $160_N$ and $161_N$, respectively. Accordingly, the voltage across the varactors $154_N$ and $155_N$ (e.g., a difference between the voltages at nodes $160_N$ and $161_N$ and the voltage at the node $162_N$) is increased or decreased, respectively, tuning the linear capacitance of the varactor unit $150_N$. In one example, the switch circuitry $158_N$ coupling node $165_1$, and, correspondingly, the nodes $160_N$ and $161_N$, to the reference voltage signal 180, the varactor unit $150_N$ is disabled, and the varactor unit $150_N$ does not provide linear capacitance tuning with reference to the voltage control signal 107. The control signal $106_M$ controls the switch circuitry $158_N$ to couple the node $165_1$, and, correspondingly, the nodes $160_N$ and $161_N$, to the bias voltage signal $142_N$ based on the control signal $106_M$ having a logic value of 1, and the control signal $106_M$ controls the switch circuitry $158_N$ to couple the node $165_1$, and, correspondingly, the nodes $160_N$ and $161_N$, to the reference voltage signal 180 based on the control signal $106_M$ having a logic value of 0.

The varactor units $150_1$-$150_N$ each receive the voltage control signal 107, and are individually controlled based on the control signals $106_1$-$106_M$ (e.g., respective bits of the control signal 106) and the bias voltage signals $142_1$-$142_N$. In one example, during a first period, a first one or more of the varactor units $150_1$-$150_N$ is enabled, and a second one or more of the varactor units $150_1$-$150_N$ is disabled. In one example, two or more of the varactor units 150 are enabled during an overlapping period of time. In another example, two or more of the varactor units 150 are disabled during an overlapping period of time. The number of the varactor units $150_1$-$150_N$ that are concurrently enabled may be equal to, less then, or greater than the number of varactor units $150_1$-$150_N$ that are concurrently disabled. In another example, during a first period, each of the varactor units $150_1$-$150_N$ are concurrently (e.g., during an overlapping period) enabled or disabled.

In one example, the gain of the LC tank circuitry 101 (and the gain of the VCO circuitry) corresponds to the number of the varactor units 150 that are enabled during an overlapping period of time. Increasing the number of the varactor units 150 that are enabled during an overlapping period of time increases the gain of the VCO circuitry 100. In one example, disabling each of the varactor units 150 during an overlapping period of time sets the gain of the LC tank circuitry 101 to zero.

The varactors 154 and 155 of each of the varactor units 150 are tunable varactors, which may be represented as capacitance $C_v$<M:0>, Where M is one or more. The varactors 154 and 155 are AC coupled to the nodes 108 and 109 via a corresponding number of fixed capacitances $C_s$<M:0>, where M is one or more. The varactor units 150 have overlapping tuning characteristics for a gain $G_v$<k>=(dCv/dVctrl), where $G_v$<k> is the gain of single varactor $C_v$(k). Based on the number of varactors 154 and 155 that are enabled and providing gain, the gain of a respective varactor unit 150 is varied from 0 to M for a $G_v$<k>. The bias voltage at nodes 160 and 161 be represented as $V_c$<k>, where k is an integer from 0-M. The bias voltage $V_c$<k> is set to either the reference voltage signal 180 or the bias voltage signal 142 based on the value of the control signal 106. In one example, $V_c$<k> is connected to the bias voltage signal 142, and the corresponding varactor unit 150 provides linear capacitance tuning versus the voltage control signal 107, and the varactor unit 150 contributes to the gain of the VCO circuitry 100. If the capacitance value of the varactors 154 and 155 ($C_v$<k>), the capacitance values of the capacitors 152 and 153 ($C_s$(k)), and the resistance values for the resistors 156 and 157 ($R_s$<k>) are the same for k=[0,M], and the varactor units 150 have equal and overlapping tuning characteristics, the gain is $G_v$<k>=(dCv/dVctrl). In example where the $V_c$<k> is connected to the reference voltage signal 180, the corresponding varactor unit 150 provides no capacitive tuning and zero gain to the VCO circuitry 100. In one example, the gain of the VCO circuitry 100 corresponds to the number of enabled varactor units 150. For example, as the number of varactor units 150 increase, the gain of the VCO circuitry 100 increases.

For a thermometric implementation of the control signal 106 (e.g., gain control bus (GCB)) the gain of varactor unit 150 is given as Gcvu=(number of bits enabled in the control signal 106)*Gcv<k>.

In one example, with reference to FIG. 1 and Table 1 below, the control signal 106 has eight bits (e.g., M=8). In such an example, a control signal 106 having a value of "00000000" corresponds to each of the switching circuitries 158 being connected to the reference voltage signal 180, and the number of varactor units 150 contributing to the gain of the VCO circuitry 100 is 0. Further, a control signal 106 having a value of "00000111" corresponds to three of switching circuitries 158 being connected to a corresponding bias voltage signal 142, five switching circuitries 158 being connected to the reference voltage signal 180, and the number of varactor units 150 contributing to the gain of the VCO circuitry 100 is 3. Additionally, a control signal 106 having a value of "11111111" corresponds to all of the switching circuitries 158 being connected to a corresponding bias voltage signal 142, and the number of varactor units 150 contributing to the gain of the VCO circuitry 100 is 8. In one example, each of the switching circuitries 158 is aligned with a respective bit position of the control signal 106.

TABLE 1

| Value of control signal 106 | Number of the switching circuitries 158 connected to the bias voltage signal 142 | Number of the switching circuitries 158 connected to the reference voltage signal 180 | Combined Gain "j" (e.g., number of enabled varactor units 150) |
|---|---|---|---|
| 00000000 | 0 | 8 | j = 0 |
| 00000001 | 1 | 7 | j = 1 |
| 00000011 | 2 | 6 | j = 2 |
| 00000111 | 3 | 5 | j = 3 |
| 00001111 | 4 | 4 | j = 4 |

TABLE 1-continued

| Value of control signal 106 | Number of the switching circuitries 158 connected to the bias voltage signal 142 | Number of the switching circuitries 158 connected to the reference voltage signal 180 | Combined Gain "j" (e.g., number of enabled varactor units 150) |
|---|---|---|---|
| 00011111 | 5 | 3 | j = 5 |
| 00111111 | 6 | 2 | j = 6 |
| 01111111 | 7 | 1 | j = 7 |
| 11111111 | 8 | 0 | j = 8 |

Extending the linearity of the VCO circuitry 100 by using multiple varactor units 150 allows the gain of the VCO circuitry 100 to be programmed. Accordingly, the VCO circuitry 100 may be utilized in more system level implementations without redesigning the corresponding VCO circuitry or the varactor units. In one example, each varactor unit 150 provides a linear gain Gv<i> in a voltage region based on a respective bias voltage signal 142. Each varactor unit 150 provides a linear characteristic in a voltage region centered about the voltage level of a respective bias voltage signal 142 (Vbias) by a delta voltage (ΔV). In one example, the linearity region of each varactor unit 150 is different within a respective voltage region. A voltage region may be from Vl,min<i> to Vl,max<i>, where Vl,min<i>=Vbias<i>−0.5×ΔV, and Vl,max<i>=Vbias<i>−0.5×ΔV.

Figure 3:
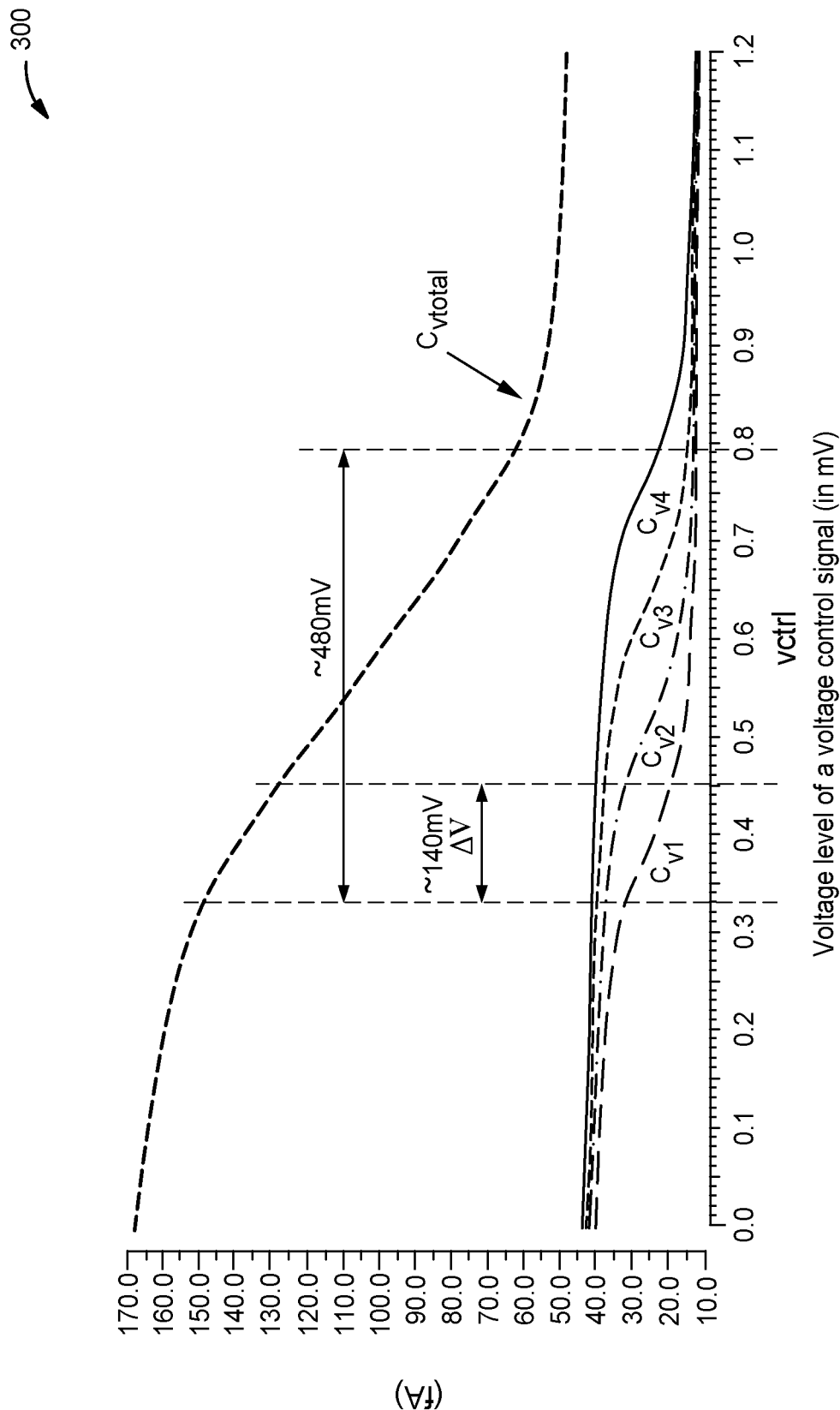
FIG. 3 depicts a graph of linear capacitance voltage characteristics of multiple varactor units of a varactor array, according to one embodiment of the present disclosure.

FIG. 3 illustrates a graph of linear capacitance voltage characteristics of multiple varactor units of a varactor array, according to one embodiment of the present disclosure. A graph 300 illustrates the capacitance voltage (CV) characteristics of the varactor array 120. $C_{V1}$ is a curve representing the capacitance voltage characteristics of a first varactor unit 150, $C_{V2}$ is a curve representing the capacitance voltage characteristics of a second varactor unit 150, $C_{V3}$ is a curve representing the capacitance voltage characteristics of a third varactor unit 150, and $C_{V4}$ is a curve representing the capacitance voltage characteristics of a fourth varactor unit 150. In the example of FIG. 3, the varactor array 120 includes four varactor units 150 (e.g., varactor unit $150_1$, $150_2$, $150_3$, and $150_4$).

$C_{Vtotal}$ is a curve representing the combination of the capacitance voltage characteristics of the varactor units 150. The use of multiple varactor units to generate $C_{Vtotal}$, increases the linear range of $C_{Vtotal}$ as compared to the linear range of each of $C_{V1}$-$C_{V4}$. For example, the linear range of $C_{V1}$ is about 140 mV and the linear range of $C_{Vtotal}$ is about 480 mV. Increasing the linear range $C_{Vtotal}$ decreases the sensitivity of the corresponding VCO circuitry. Accordingly, the VCO circuitry provides output signals over a wider range of voltages with reduced jitter and noise. In one or more examples, the linear voltage range of $C_{Vtotal}$ for VCO circuitry may be varied based on a parameters of a corresponding charge pump or other circuit elements connected to the VCO circuitry. For example, the number of varactor units 150 may be enabled or disabled to generate a linear voltage range of $C_{Vtotal}$ that is aligned with the parameters of a charge pump and/or other circuit elements connected to the VCO circuitry.

Figure 4:
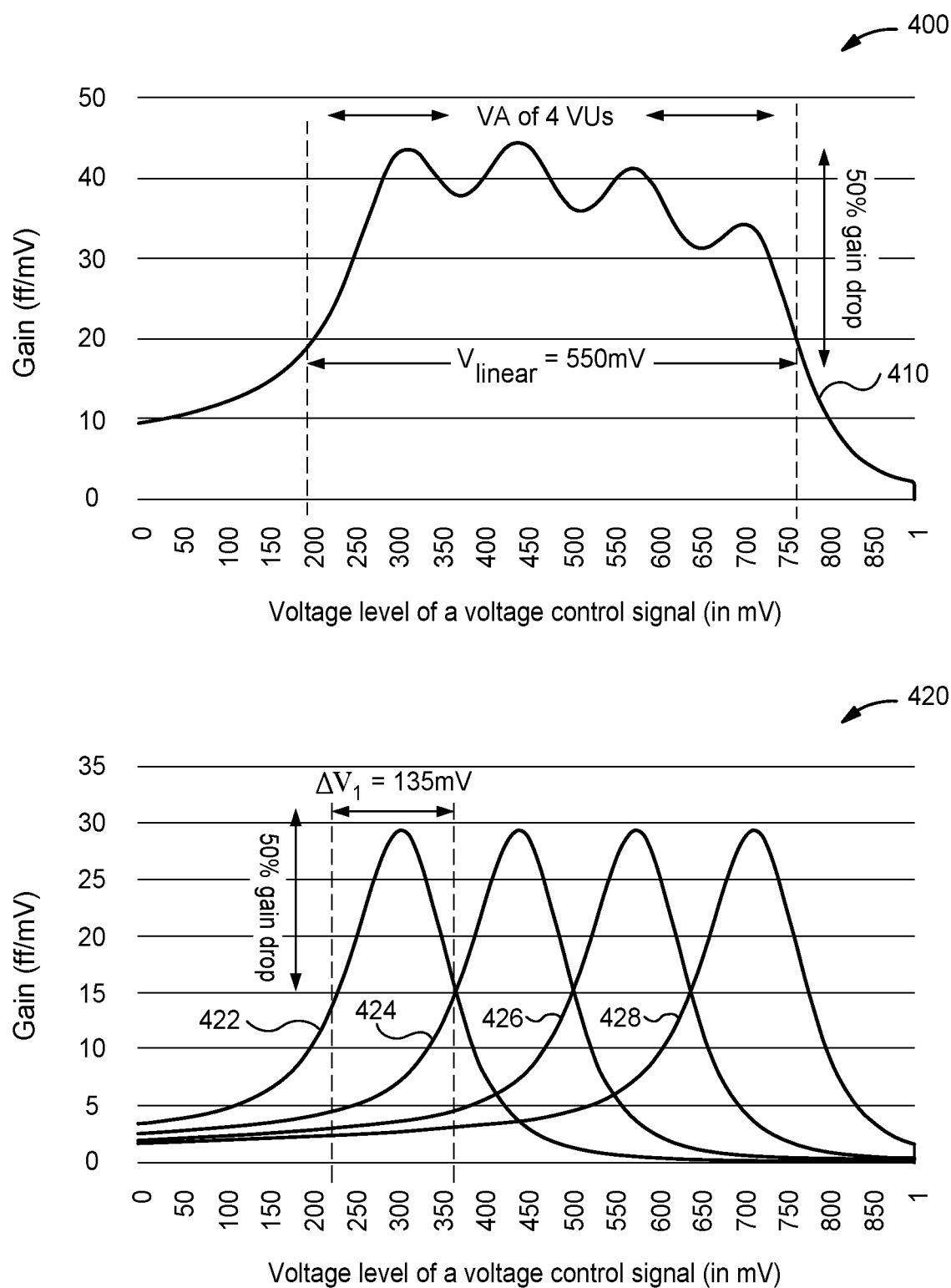
FIG. 4 depicts graphs of gain characteristics of varactor units of a varactor array, according to one embodiment of the present disclosure.

FIG. 4 illustrates graphs of gain characteristics of varactor units of a varactor array, according to one embodiment of the present disclosure. A graph 400 illustrates a gain curve 410. The gain curve 410 corresponds to a varactor array (e.g., the varactor array 120 of FIG. 1) having four varactor units (e.g., the varactor units 150 of FIG. 1) enabled. The gain curve 410 illustrates a 50 percent gain drop with a linear range of 550 mV. In one example, the gain of a varactor unit (e.g., the varactor unit 150) is the change in varactor capacitance per unit charge in varactor voltage. For example, with reference to FIG. 1, for a voltage difference (Vctrl) between the nodes 162 and 160, gain is $$G_c = \frac{\Delta C_v}{\Delta V_{ctrl}}.$$

A gain drop corresponds to less capacitance for a change in voltage and less tenability of the corresponding VCO frequency with respect to Vctrl. As is discussed with regard to FIG. 3, the linear range may be altered by varying the voltage level of the bias voltage signals 142. The amount of gain is adjusted based on the number of varactor units 150 that are enabled. A graph 420 illustrates the individual gain curves for four different varactor units (e.g., the varactor units 150 of FIG. 1). The gain curve 422 corresponds to a first varactor unit 150, the gain curve 424 corresponds to a second varactor unit 150, the gain curve 426 corresponds to a third varactor unit 150, and the gain curve 428 corresponds to a fourth varactor unit 150. In one example, the voltage range over which there is a 50 percent gain drop is 135 mV. The gain curve 410 is generated from the gain curves 422-428.

Figure 5A:
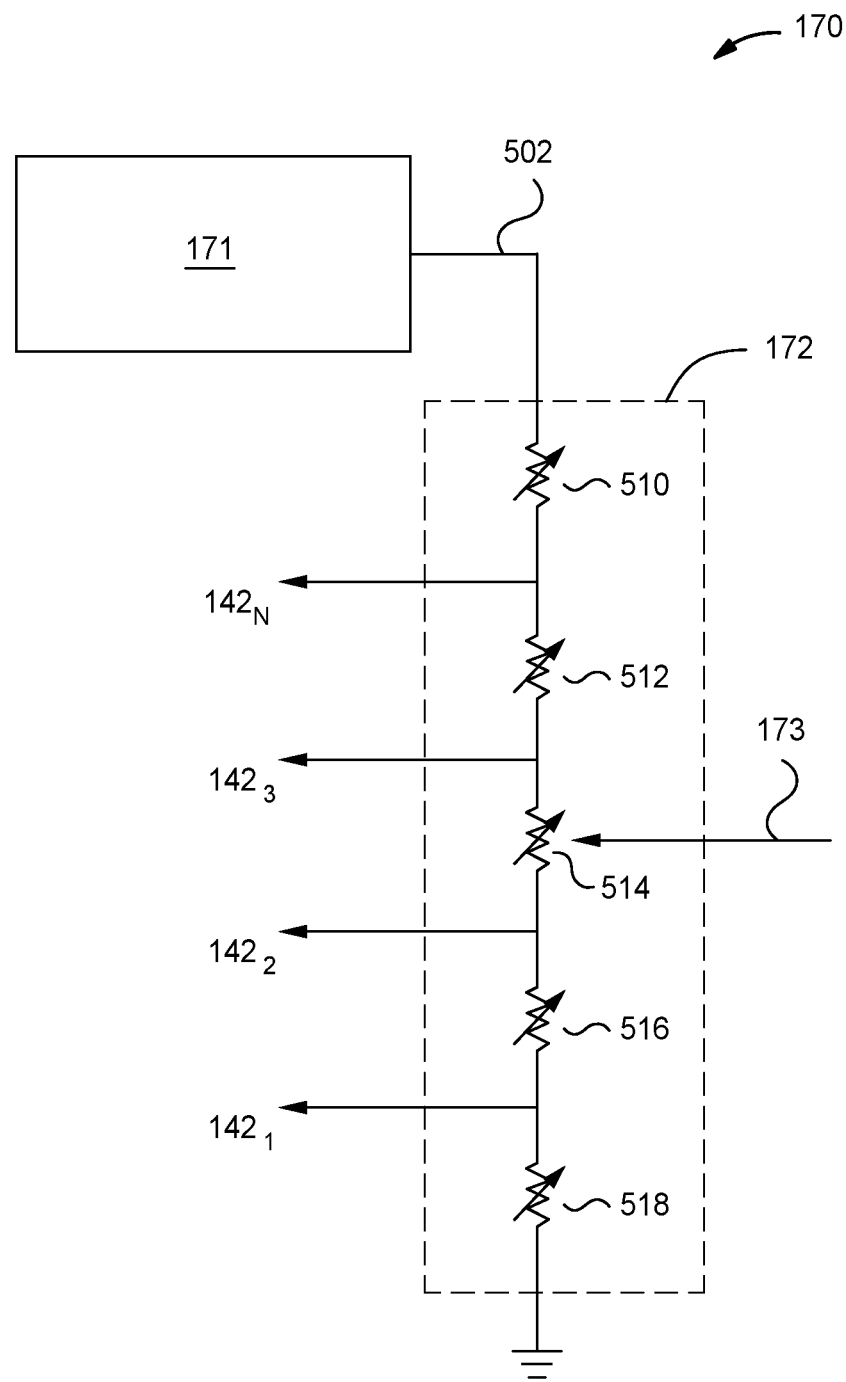
FIG. 5A depicts a schematic diagram of bias voltage generation circuitry, according to one embodiment of the present disclosure.

FIG. 5A illustrates a schematic diagram of bias voltage generator circuitry, according to one embodiment of the present disclosure. The bias voltage generator circuitry 170 includes the voltage generation circuitry 171 and the resistor string 172. The bias voltage generator circuitry 170 generates the bias voltage signals $142_1$-$142_N$. The voltage generation circuitry 171 generates a voltage signal 502 that is received by the resistor string 172. The resistor string 172 includes resistors 510-518. The resistors 510-518 of the resistor string 172 generate the bias voltage signals $141_1$-$141_N$. In one example, a different bias voltage signal 141 is output from the each node between the resistors 510-518. The bias voltage signal $142_N$ is generated from the node between the resistors 510 and 512, the bias voltage signal $142_3$ is generated from the node between the resistors 512 and 514, the bias voltage signal $142_2$ is generated from the node between the resistors 514 and 516, and the bias voltage signal $142_1$ is generated from the node between the resistors 516 and 518. The voltage level of the bias voltage signal $142_1$ is less than the voltage level of the bias voltage signal $142_2$. The voltage level of the bias voltage signal $142_2$ is less than the voltage level of the bias voltage signal $142_3$. The voltage level of the bias voltage signal $142_3$ is less than the voltage level of the bias voltage signal $142_N$. In one example, the resistor string 172 generates the bias voltage signals $142_1$-$142_N$ with voltage levels that are evenly offset from each other (e.g., bias voltage signals 142 that have an even voltage steps with reference to each other). In one example, the different voltage levels of the bias voltage signals 142 are separated by equal step sizes where the voltage level of each bias voltage signal 142 is separated by a voltage step size (e.g., $V_{step\_size}$). The difference between the voltage levels of the bias voltage signal may be determined based on k times the $V_{step\_size}$ (e.g., $k*V_{step\_size}$), where k is one or more. In one example, $V_{step\_size}$ is a design parameter for the varactor array 120 or a varactor unit 150. In another example, the resistor string 172 generates one or more bias voltage signals $142_1$-$142_N$ having different voltage step sizes.

In one or more examples, the number of the resistors 510-518 of the resistor string 172 corresponds to the number of bias voltage signals 142 generated by the bias voltage generation circuitry 170. In one example, the number of resistors 510-518 is greater than the number of the number of bias voltage signals 142. In one specific example, the bias voltage generator circuitry 170 generates the bias voltage signals $142_1$-$142_N$, where N is four. In such an example, the resistor string 172 includes five resistors (e.g., the resistors 510-518). In another example, the bias voltage generator circuitry 170 generates bias voltage signals $142_1$-$142_N$, where N is greater than four. In such an example, the resistor string 172 includes N+1 resistors that is one more resistor than bias voltage signals.

In one or more examples, adjusting the voltage level of the bias voltage signals 142, adjusts the linear range of the varactor units 150. The bias voltage generator circuitry 170 is adjusted by the control signal 173 to adjust the offset of the voltage levels of the bias voltage signals 142. The control signal 173 adjusts the resistance of the resistors of the resistor string 172. For example, the control signal 173 increases or decreases the resistance of the resistors of the resistor string 172. The resistor string 172 is adjustable to vary the voltage step size and/or the voltage level of the bias voltage signals 142. In one example, the resistors 510-518 are variable resistors having a resistance that is adjustable by the control signal 173. The resistance of the resistors 510-518 is increased or decreased to decrease or increase, respectively, the voltage level of the bias voltage signals 142. In another example, the voltage value of the voltage signal 502 is adjusted (e.g., by using a programmable digital to analog converter). For example, increasing the voltage value of the voltage signal 502 increases the voltage value of the bias voltage signals 142, and decreases the voltage value of the voltage signal 502 decreases the voltage value of the bias voltage signals 142. In another example, a combination of methods may be used to adjust the voltage level of the bias voltage signals 142. Adjusting the voltage level of the bias voltage signals 142 changes the corresponding CV curves. For example, with reference to FIG. 3, increasing the voltage level of the bias voltage signals 142 shifts the CV curves $C_{V1}$, $C_{V2}$, $C_{V3}$, and $C_{V4}$ to the right along the X-axis. Further, decreasing the voltage level of the bias voltage signals 142 shifts the CV curves $C_{V1}$, $C_{V2}$, $C_{V3}$, and $C_{V4}$ to the left along the X-axis In one example, the CV characteristics of each varactor unit 150 and the corresponding varactor array 120 is varied based on the voltage level of the bias voltage signals 142. For example, increasing the voltage level of the bias voltage signal 142 increases the gain of the corresponding varactor array 120.

In one or more examples, the linear range of a varactor unit 150 for a given technology node corresponds to the voltage step size. In such an example, for a varactor array (e.g., the varactor array 120) having N varactor units (e.g., varactor units 150), the linear range of the varactor array is N times the linear range of each varactor unit 150. Accordingly, for different technology nodes, the linear voltage range of a varactor array, and corresponding VCO circuitry, is scalable using multiple varactor units.

In one or more examples, the control signal 173 is provided via a corresponding control bus. The control bus may be referred to as a level control bus (LCB). The LCB is a binary bus of L+1 bits (LCB<L:0>). Accordingly, the linear range of a varactor array (e.g., the varactor array 120) can be programmed to 2(L+1)−1 different levels. Table 2 illustrates one specific example of the association between the control signal 173 and the voltage levels of the bias voltage signals 142. In one example, the offset voltages between different levels of the same bias voltage signal 142 is about 25 mv. In other examples, other offset voltages may be used. Specifically, in the example of Table 2, L=8, the offset voltage=25 mV, and the starting bias voltage=400 mV.

TABLE 2

| Control signal 173 (LCB<2:0>) | Bias voltage signal $141_1$ | Bias voltage signal $141_2$ | Bias voltage signal $141_3$ | Bias voltage signal $141_4$ |
|---|---|---|---|---|
| 000 | 400 mV | 525 mV | 650 mV | 775 mV |
| 001 | 425 mV | 550 mV | 675 mV | 800 mV |
| 010 | 450 mV | 575 mV | 700 mV | 825 mV |
| 011 | 475 mV | 600 mV | 725 mV | 850 mV |
| 100 | 500 mV | 625 mV | 750 mV | 875 mV |
| 101 | 525 mV | 650 mV | 775 mV | 900 mV |
| 110 | 550 mV | 675 mV | 800 mV | 925 mV |
| 111 | 575 mV | 700 mV | 825 mV | 950 mV |

Figure 5B:
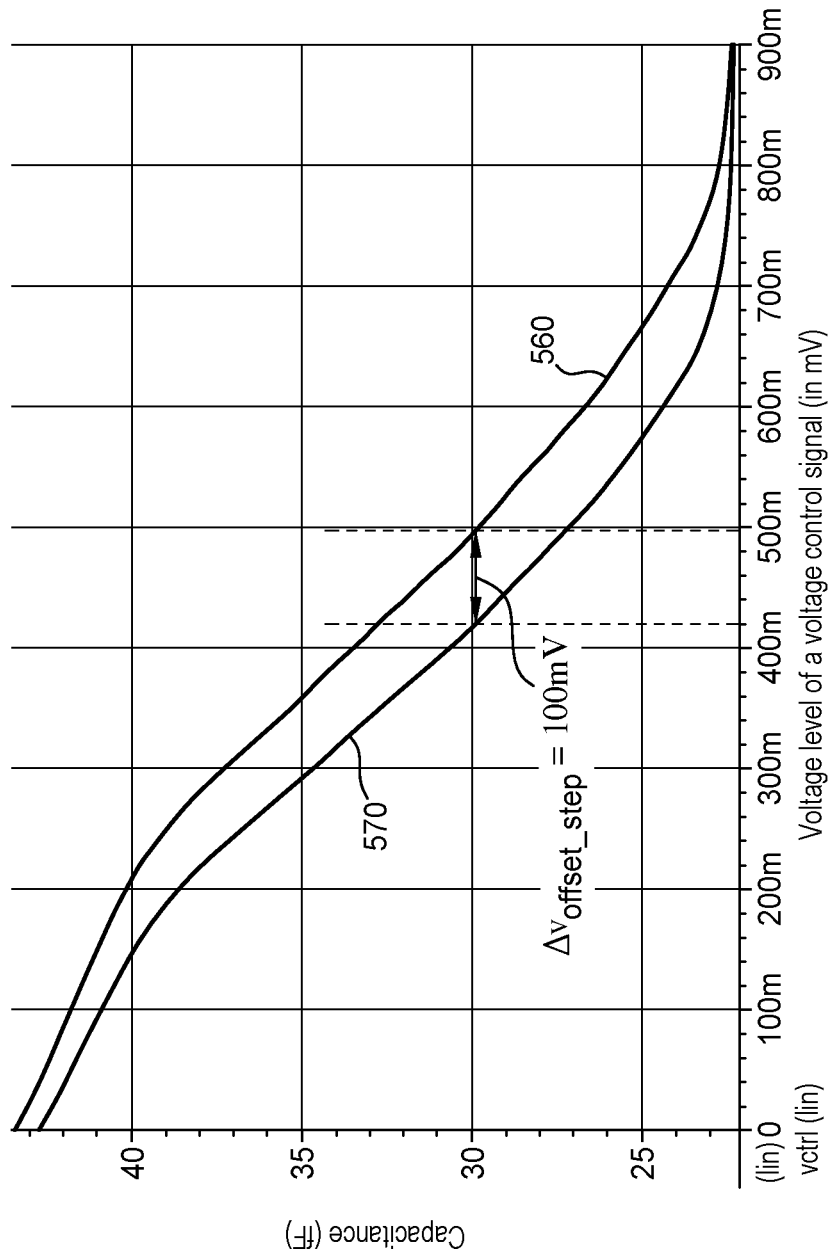
FIG. 5B depicts a graph of linear voltage adjustment curves a varactor array, according to one embodiment of the present disclosure.

FIG. 5B illustrates a graph of a linear range of a varactor array at different offset voltages, according to one embodiment of the present disclosure. The graph includes curves 560 and 570. With reference to FIG. 1, the curves 560 and 570 correspond to linear ranges of the varactor array 120 based on the control signal 173 having different values. In the illustrated example, the control signal 173 that generates the curve 560 has a higher bit value (e.g., a bit value of 1) than the control signal that generates the curve 570 (e.g., a bit value of 0). The voltage offset step (e.g., $\Delta V_{offset\_step}$) is 100 mV. In other examples, the voltage offset step may be greater than or less than 100 mV.

Figure 6:
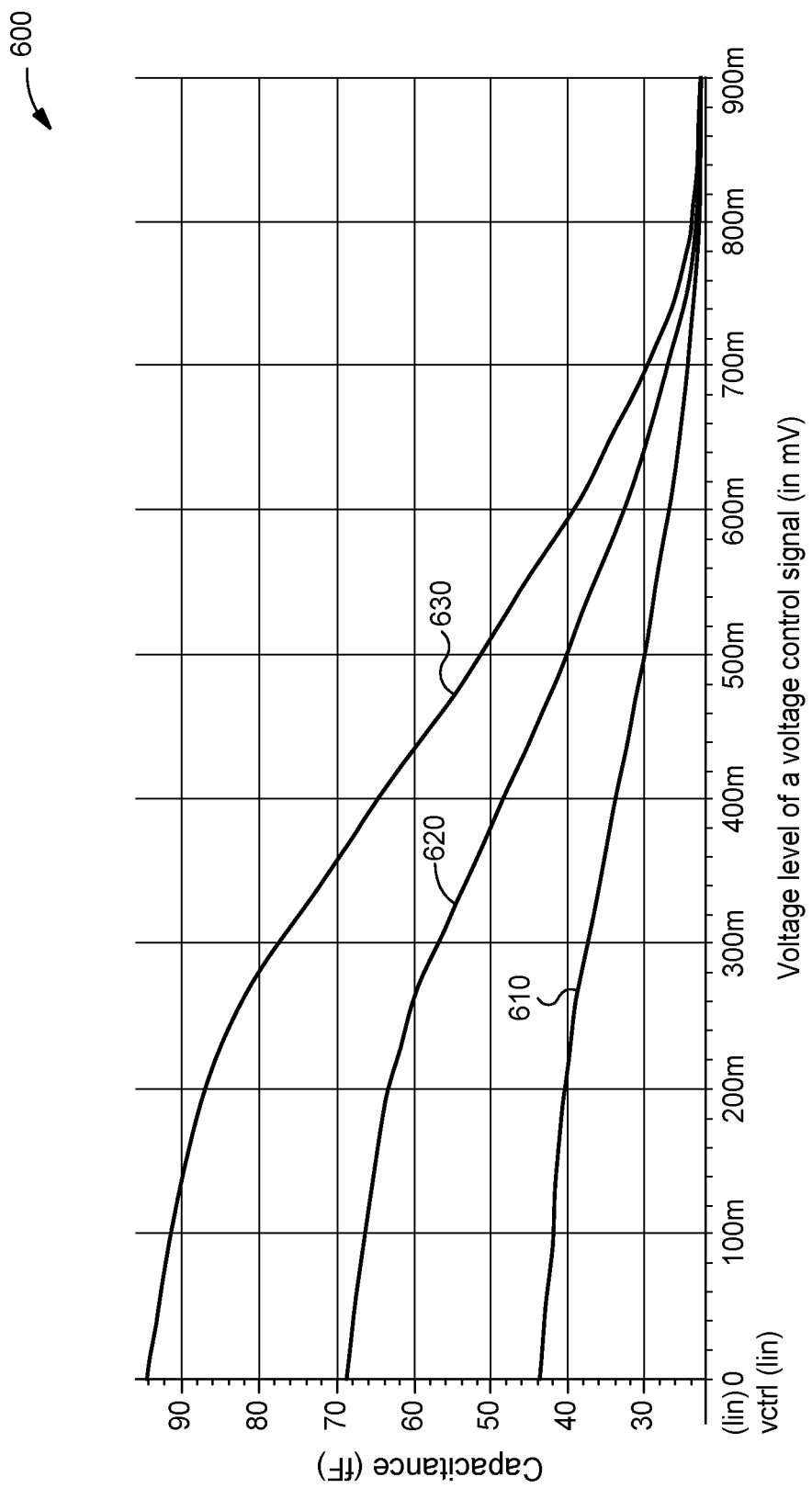
FIG. 6 depicts a graph of capacitive voltage curves of varactor units of a varactor array, according to one embodiment of the present disclosure.

FIG. 6 illustrates a graph 600 of capacitive voltage curves of varactor units of a varactor array, according to one embodiment of the present disclosure. The graph 600 illustrates the CV curves associated with a varactor array (e.g., the varactor array 120) based on the different bit values of the control signal 106. With reference to FIG. 1, the CV curve 610 corresponds to a control signal $106_1$ having a logic value of 1 (e.g., a bit value of 1) and control signals $106_2$ and $106_M$ having a logic value of 0 (e.g., a bit value of 0). Accordingly, the varactor unit $150_1$ is enabled and the varactor units $150_2$ and $150_N$ are disabled. With further reference to FIG. 1, the CV curve 620 corresponds to the control signals $106_1$ and $106_2$ having a logic value of 1 (e.g., a bit value of 1) and the control signal $106_M$ having a logic value of 0 (e.g., a bit value of 0). Accordingly, the varactor units $150_1$ and $150_2$ are enabled and the varactor unit $150_N$ is disabled. Further, the CV curve 630 corresponds to the control signals $106_1$, $106_2$, and $106_M$ having a logic value of 1 (e.g., a bit value of 1). Accordingly, the varactor units $150_1$, $150_2$, and $150_N$ are enabled. As can be seen from the FIG. 6, increasing the number of enabled varactor units 150 increases the gain of the varactor array 120.

Figure 7:
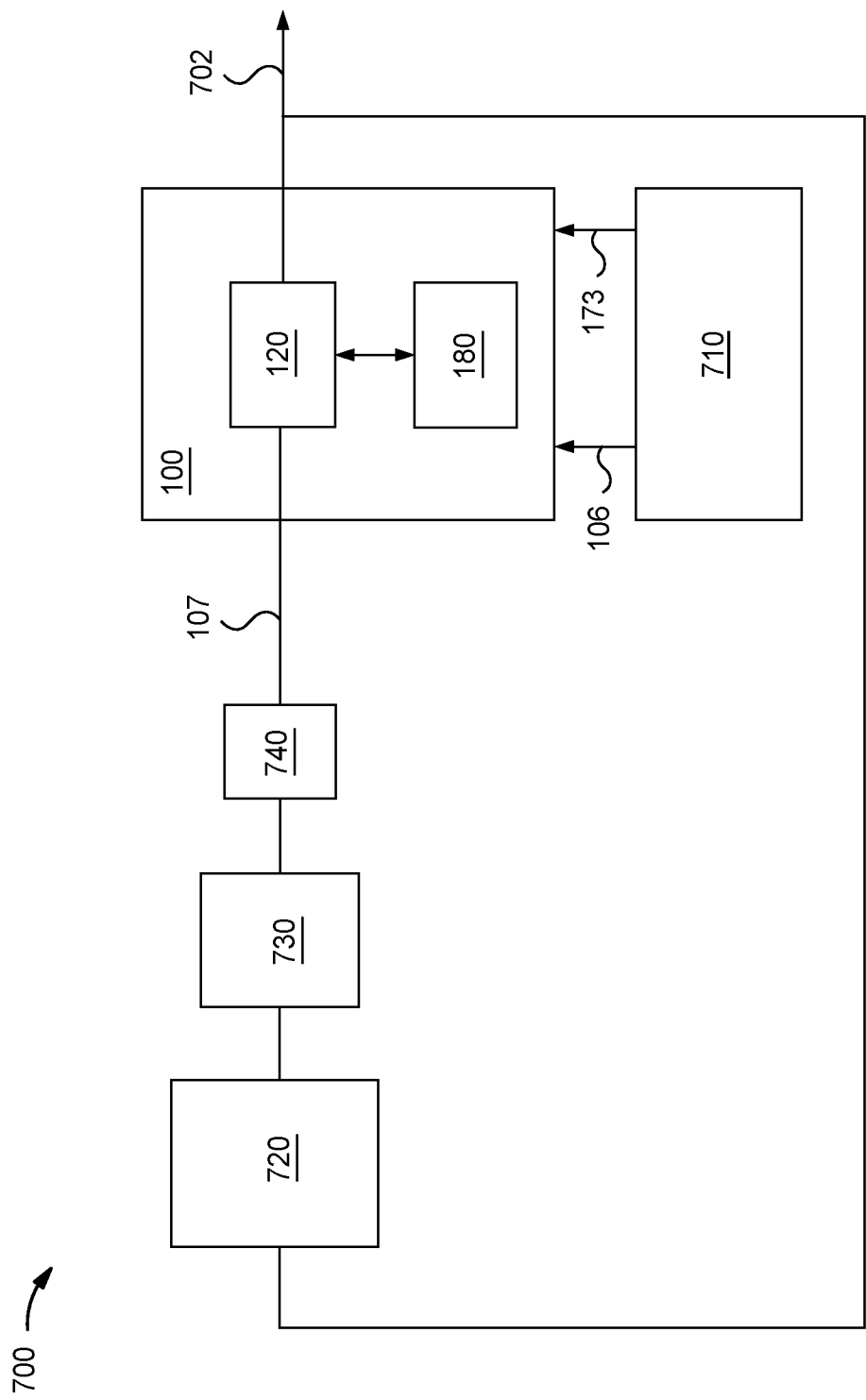
FIG. 7 depicts a schematic block diagram of phase locked loop circuitry, according to one embodiment of the present disclosure.

FIG. 7 illustrates a schematic block diagram of phase locked loop (PLL) circuitry, according to one embodiment of the present disclosure. A PLL circuitry 700 generates an output signal 702 at a target frequency. The PLL circuitry 700 includes control circuitry 710, phase frequency detector circuitry 720, charge pump circuitry 730, filter circuitry 740, and the VCO circuitry 100. The control circuitry 710 is connected to the output of the LC tank circuitry 101 and receives the output signal 702. The control circuitry 710 generates the control signal 106, and the control signal 173. In one example, the control circuitry 710 generates one or more of the control signal 106 and the control signal 173 based on the output signal 702 and/or other operating parameters. The control circuitry 710 generates one or more of the control signal 106 and the control signal 173 to increase or decrease the voltage level of the output signal 702.

The phase frequency detector circuitry 720 detects phase and frequency of the output signals 702 and generates control signals output to the charge pump circuitry 730 based on at least one of phase and frequency differences in the output signal 702. The charge pump circuitry 730 receives the control signals from the phase frequency detector circuitry 720 and generates the voltage control signal 107 output to the VCO circuitry 100. The voltage control signal 107 is filtered by the filter circuitry 740 before being received by the VCO circuitry 100. The filter circuitry 740 may be a low pass filter. The filtered voltage signal is received by the VCO circuitry 100. The VCO circuitry 100 generates the output signals 702 based on the voltage control signal 107, the number of enabled varactor units 150 in the varactor array 120, and the voltage level of the bias voltage output by the bias voltage generator circuitry 170.

In one example, the VCO circuitry 100 is controlled to generate the output signal 702 at a target frequency (e.g., an oscillation frequency). The target frequency is controlled based on the voltage control signal 107. When the frequency of the output signal 702 is greater than the target frequency, the voltage control signal 107 is adjusted to decreases the frequency of the output signal 702. The voltage control signal 107 is adjusted based on a negative phase error determined by the phase frequency detector circuitry 720 from the received output signal 702. Further, when the target frequency is less than the target frequency, the voltage control signal 107 is adjusted to increase the frequency of the output signal 702. The voltage control signal 107 is adjusted based on a positive phase error determined by the phase frequency detector circuitry 720 from the received output signal 702. Accordingly, for any deviation of the frequency the output signal 702 above or below the target frequency the VCO circuitry 100 is controlled to adjust the frequency of the output signal 702 accordingly.

Figure 8:
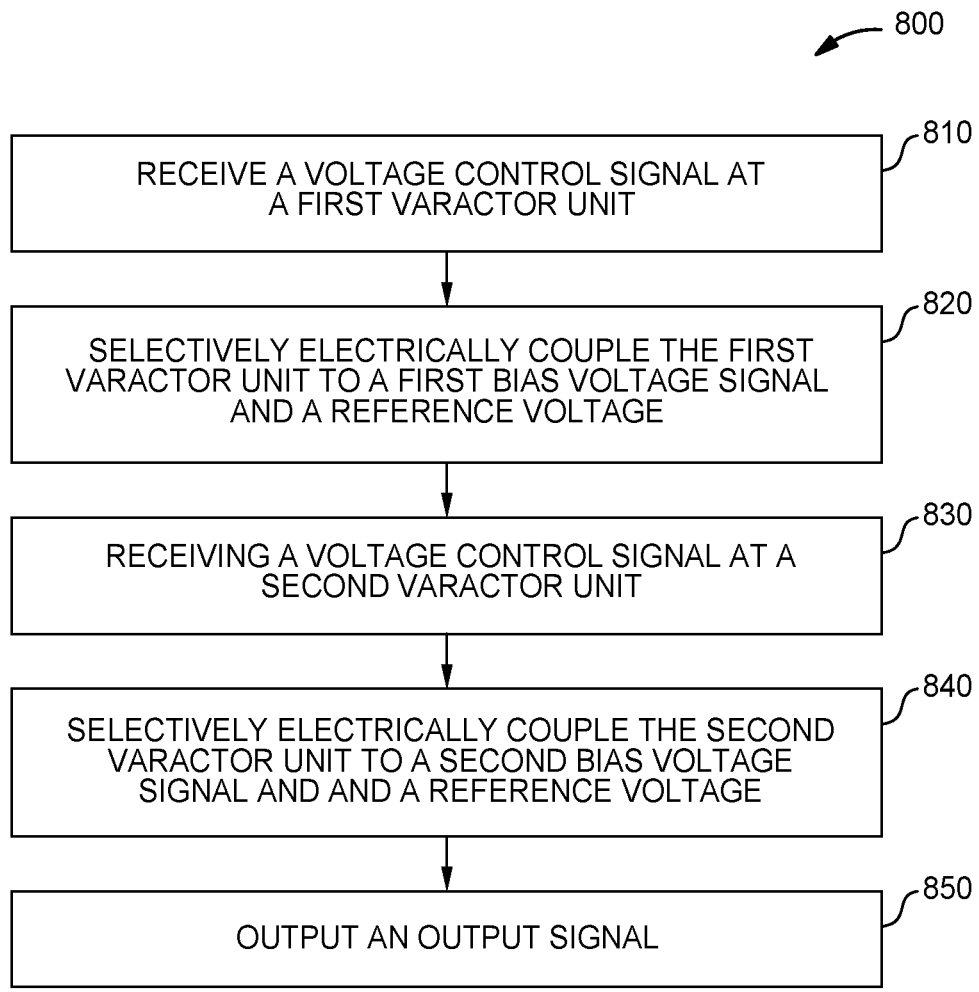
FIG. 8 illustrates a flowchart of a method for operating a voltage controlled oscillator, according to one embodiment of the present disclosure.

FIG. 8 illustrates a flowchart of a method for operating a VCO, according to one embodiment of the present disclosure. A method 800 is described with regard to FIG. 1 and FIG. 2. At 810 of the method 800, a voltage control signal is received at a first varactor unit. For example, the voltage control signal 107 is received at the node $162_1$ of the varactor unit $150_1$ of the varactor array 120.

At 820 of the method 800, the first varactor unit is selectively electrically coupled to a first bias voltage signal and a reference bias voltage signal. For example, the varactor unit $150_1$ is selectively electrically connected to the bias voltage signal $142_1$ to enable the varactor unit $150_1$ and the reference voltage signal 180 to disable the varactor unit $150_1$ based on the control signal $106_1$. In one example, the varactor $154_1$ is connected to the node $160_1$ and the varactor $155_1$ is connected to the node $161_1$. The nodes $160_1$ and $161_1$ are electrically coupled to the switch circuitry $158_1$ via the resistors $156_1$ and $157_1$. The switch circuitry $158_1$ couples the nodes $160_1$ and $161_1$ to the output of the bias voltage generation circuitry 170 to receive the bias voltage signal $142_1$ based on the control signal $106_1$ having a first value (e.g., a logic value of 1). The switch circuitry $158_1$ couples the nodes $160_1$ and $161_1$ to the output of the reference voltage signal 180 based on the control signal $106_1$ having a second value (e.g., a logic value of 0). In one example, disabling the varactor unit $150_1$ decreases the capacitance of the LC tank circuitry 101 and enabling the varactor unit $150_1$ increases the capacitance of the LC tank circuitry 101.

At 830 of the method 800, the voltage control signal is received at a second varactor unit. For example, the voltage control signal 107 is received at the node $162_2$ of the varactor unit $150_2$ of the varactor array 120.

At 840 of the method 800, the second varactor unit is selectively electrically coupled to a second bias voltage signal and a reference bias voltage signal. For example, the varactor unit $150_2$ is selectively electrically connected to the bias voltage signal $142_2$ and the reference voltage signal 180 based on the control signal $106_1$. In one example, the varactor $154_2$ is connected to the node $160_2$ and the varactor $155_2$ is connected to the node $161_2$. The nodes $160_2$ and $161_2$ are electrically coupled to the switch circuitry $158_2$ via the resistors $156_2$ and $157_2$. The switch circuitry $158_2$ couples the nodes $160_2$ and $161_2$ to the output of the bias voltage generation circuitry 170 to receive the bias voltage signal $142_2$ based on the control signal $106_2$ having a first value (e.g., a logic value of 1). The switch circuitry $158_2$ couples the nodes $160_2$ and $161_2$ to the output of the reference voltage signal 180 based on the control signal $106_2$ having a second value (e.g., a logic value of 0). In one example, disabling the varactor unit $150_2$ decreases the capacitance of the LC tank circuitry 101 and enabling the varactor unit $150_2$ increases the capacitance of the LC tank circuitry 101.

At 850 of the method 800, an output signal is output. For example, the VCO circuitry 100 outputs the output signal 102. The output signal has an oscillation frequency that corresponds to the capacitance of the LC tank circuitry 101. In one example, the oscillation frequency is decreased by a first amount based on enabling the varactor unit $150_1$ and disabling the varactor unit $150_2$. Further, the oscillation frequency is decreased by a second amount based on enabling the varactor unit $150_1$ and enabling the varactor unit $150_2$. The second amount is greater than the first amount. Further, as is described with regard to FIGS. 3, 4, and 6, increasing the number of enabled varactor units 150 via the control signal 106 increases the gain of the varactor array 120 and the corresponding VCO circuitry 100. Further, increasing the voltage level of the bias voltage signal 142 increases the voltage level of the linear range of the varactor units 150 and the corresponding varactor array 120.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A voltage controlled oscillator (VCO) circuitry comprising:
   a varactor array comprising:
      a first varactor unit coupled between a first output node and a second output node, the first varactor unit comprising:
         a first varactor connected to a first node and a second node, the first node disposed between the first output node and the first varactor;
         a second varactor connected to the second node and a third node, the third node disposed between the second node and the second output node, wherein the second node is configured to receive a voltage control signal; and first switch circuitry electrically coupled to a fourth node disposed between the first node and the third node, the first switch circuitry selectively electrically couples a first voltage signal or a second voltage signal to the first node and the third node based on a first control signal to selectively enable or disable the first varactor unit.

2. The VCO circuitry of claim 1, wherein the first voltage signal is a first bias voltage signal.

3. The VCO circuitry of claim 2 further comprising a bias voltage generator circuitry configured to output the first bias voltage signal.

4. The VCO circuitry of claim 1, wherein the second voltage signal is a reference voltage signal.

5. The VCO circuitry of claim 1 further comprises:
a second varactor unit comprising:
a third varactor coupled to a fifth node and a sixth node;
a fourth varactor coupled to the sixth node and a seventh node, wherein the sixth node is configured to receive the voltage control signal; and
second switch circuitry electrically coupled to the fifth node and the seventh node, the second switch circuitry selectively couples a third voltage signal to the fifth node and the seventh node based on a second control signal.

6. The VCO circuitry of claim 5, wherein the third voltage signal is selected from the group consisting of a second bias voltage signal and a reference voltage signal.

7. The VCO circuitry of claim 1, wherein the VCO circuitry is configured to output an output signal having an oscillation frequency, and wherein the varactor array is configured adjust the oscillation frequency of the output signal based on selectively coupling the first node and the third node to the first voltage signal.

8. A varactor array comprising:
a first varactor unit configured to receive a first control signal and a voltage control signal, wherein the first varactor unit selectively receives a first bias voltage signal or a reference voltage signal to respectively enable or disable the first varactor unit based on the first control signal; and
a second varactor unit configured to receive a second control signal and the voltage control signal, wherein the second varactor unit selectively receives a second bias voltage signal or the reference voltage signal to respectively enable or disable the second varactor unit based on the second control signal,
wherein the varactor array outputs an output signal based on one or more of a first voltage difference and a second voltage difference, wherein the first voltage difference is between the voltage control signal and the first bias voltage signal, and wherein the second voltage difference is between the voltage control signal and the second bias voltage signal.

9. The varactor array of claim 8, wherein during a first period, a first one of the first varactor unit and the second varactor unit is enabled and a second one of the first varactor unit and the second varactor unit is disabled.

10. The varactor array of claim 8, wherein the first varactor unit is coupled in parallel with the second varactor unit.

11. The varactor array of claim 8, wherein the first varactor unit comprises:
a first varactor connected to a first node configured to receive the voltage control signal;
a second varactor connected to the first node and in series with the first varactor; and
first switch circuitry coupled to the first varactor and the second varactor, and configured to selectively connect the first varactor and second varactor with the first bias voltage signal and the reference voltage signal based on the first control signal.

12. The varactor array of claim 8 further comprising:
a third varactor unit configured to receive the voltage control signal, wherein the second varactor unit selectively receives one of a third bias voltage signal and the reference voltage signal to respectively enable or disable the third varactor unit based on a third control signal.

13. The varactor array of claim 8, wherein a voltage level of the second bias voltage signal is greater than a voltage level of the first bias voltage signal.

14. The varactor array of claim 13, wherein a voltage level of the voltage control signal is greater than a voltage level of the reference voltage signal and less than a voltage level of the first bias voltage signal.

15. A method for operating voltage controlled oscillator (VCO) circuitry, the method comprising:
receiving, by a first varactor unit of inductor capacitor (LC) tank circuitry, a voltage control signal;
selectively electrically coupling the first varactor unit to a first bias voltage signal to enable the first varactor unit and a reference voltage signal to disable the first varactor unit based on a first control signal;
receiving, by a second varactor unit of the LC tank circuitry, the voltage control signal;
selectively enabling coupling the second varactor unit to a second bias voltage signal to enable the second varactor unit and the reference voltage signal to disable the second varactor unit based on a second control signal, wherein enabling at least one of the first varactor unit and the second varactor unit adjusts a capacitance of the LC tank circuitry, wherein the second control signal and the first control signal are different; and
outputting an output signal having an oscillation frequency based on the voltage control signal and the adjusted capacitance of the LC tank circuitry.

16. The method of claim 15, wherein selectively electrically coupling the first varactor unit to the first bias voltage signal and the reference voltage signal based on the first control signal comprises electrically coupling the first varactor unit to the first bias voltage signal, enabling first varactor unit, and selectively electrically coupling the second varactor unit to the second bias voltage signal and the reference voltage signal based on the second control signal comprises electrically coupling the second varactor unit to the second bias voltage signal, enabling the second varactor unit.

17. The method of claim 15, wherein selectively electrically coupling the first varactor unit to the first bias voltage signal and the reference voltage signal based on the first control signal comprises electrically coupling the first varactor unit to the first bias voltage signal, enabling first varactor unit, and selectively electrically coupling the second varactor unit to the second bias voltage signal and the reference voltage signal based on the second control signal comprises electrically coupling the second varactor unit to the reference voltage signal, disabling the second varactor unit.

18. The method of claim 15, wherein a voltage level of the second bias voltage signal is greater than a voltage level of the first bias voltage signal.

19. The method of claim 15 further comprising adjusting a voltage level of the first bias voltage signal and the second bias voltage signal.

20. The method of claim 15 further comprising:
receiving, by a third varactor unit of the LC tank circuitry, the voltage control signal; and
selectively electrically coupling the third varactor unit to a third bias voltage signal and the reference voltage signal based on a third control signal, wherein the first control signal and the third control signal are different.

* * * * *